(12) United States Patent
Liang et al.

(10) Patent No.: US 11,706,892 B1
(45) Date of Patent: Jul. 18, 2023

(54) APPARATUS FOR BOARD INSTALLATION

(71) Applicant: ZT Group Int'l, Inc., Secaucus, NJ (US)

(72) Inventors: David Liang, Secaucus, NJ (US); Jun Lu, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/354,320

(22) Filed: Jun. 22, 2021

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | |
|---|---|---|---|
| 9,506,265 B1* | 11/2016 | Lee | F16C 29/046 |
| 2004/0136165 A1* | 7/2004 | Wang | G06F 1/181 |
| | | | 312/223.2 |
| 2020/0245766 A1* | 8/2020 | Rechberg | F16C 29/045 |

* cited by examiner

*Primary Examiner* — James Wu
*Assistant Examiner* — Christopher L Augustin
(74) *Attorney, Agent, or Firm* — Dergosits & Noah LLP; Todd A. Noah (57) ABSTRACT

An apparatus is provided for loading an electronic device, e.g., a populated GPU board, onto a device tray, e.g., a GPU tray, where the electronic device is cumbersome and the device tray presents obstacles that prevent simply lowering the device into the tray. The apparatus includes a dolly and a base, the base configured to position the dolly against the device tray so that the dolly, carrying the board, may slide the device into position and then be removed from beneath the device.

16 Claims, 9 Drawing Sheets

APPARATUS FOR BOARD INSTALLATION

BACKGROUND

Figure 1:
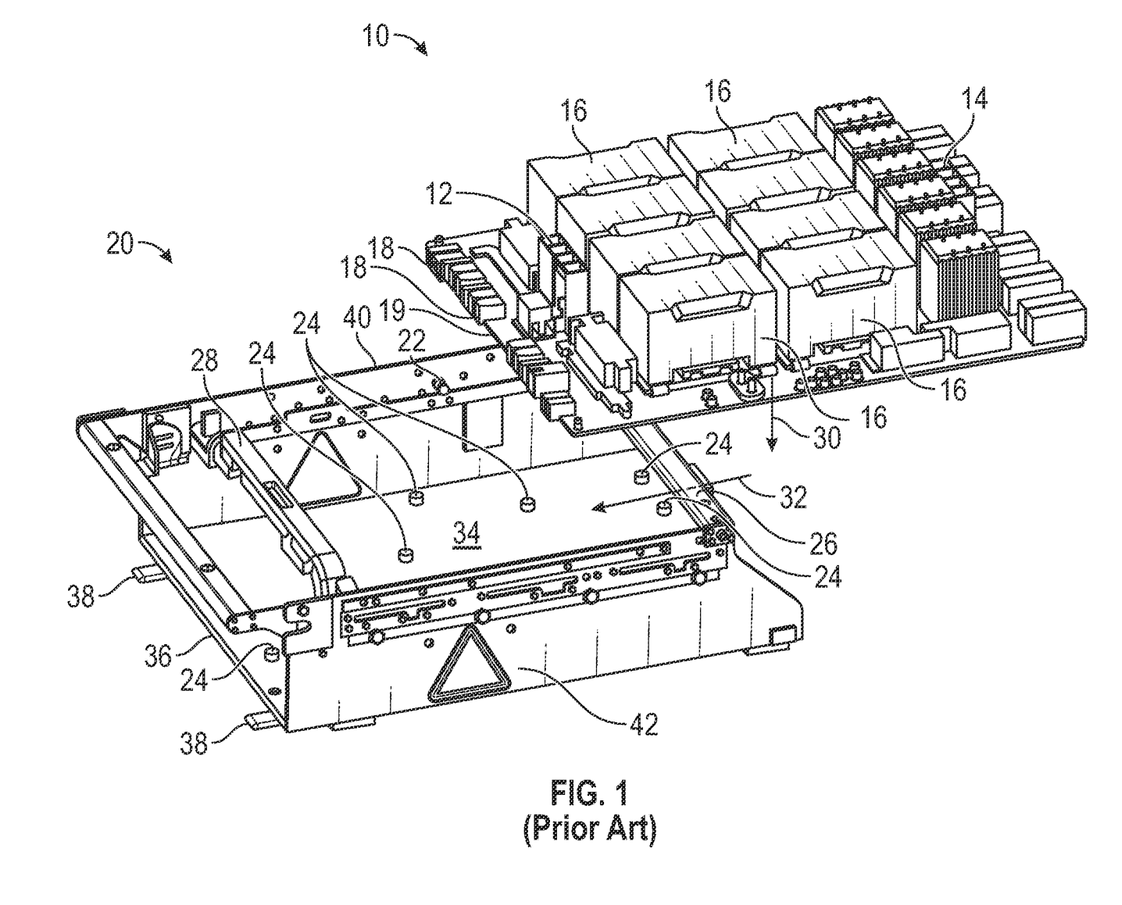
FIG. 1 is a front right isometric view of a prior art GPU board and a prior art GPU tray.

The installation of a GPU board into a GPU tray is a process that involves maneuvering a bulky and heavy into a confined space where both the board and the tray have exposed and sometimes fragile features. The process invites damage to both the board and the tray. FIG. 1 is a front right isometric view of a prior art GPU board 10 and a prior art GPU tray 20. This GPU board includes 16 captive screws used to fasten board 10 to the chassis or a sub-system sheet metal tray. GPU board 10 is to be installed on a GPU tray 20. However, to do so, the operator needs to remove metal beams 26, 28, carefully lower GPU board 10 down 30 beside tray 20 using handles 12, 14, and then translate 32 board 10 into GPU tray 20. During translation, board 10 is threaded between beam 26 and surface 34, and between tray walls 40, 42. During the translation, board 10 must also be elevated enough above tray surface 34 that the bottom of board 10 avoids standoffs 24 on surface 34, which could damage components on the bottom of GPU board 10. When GPU board 10 is in position, board front edge 19 aligns with tray floor edge 36 and standoffs 24 are aligned with corresponding holes in board 10.

Figure 2:
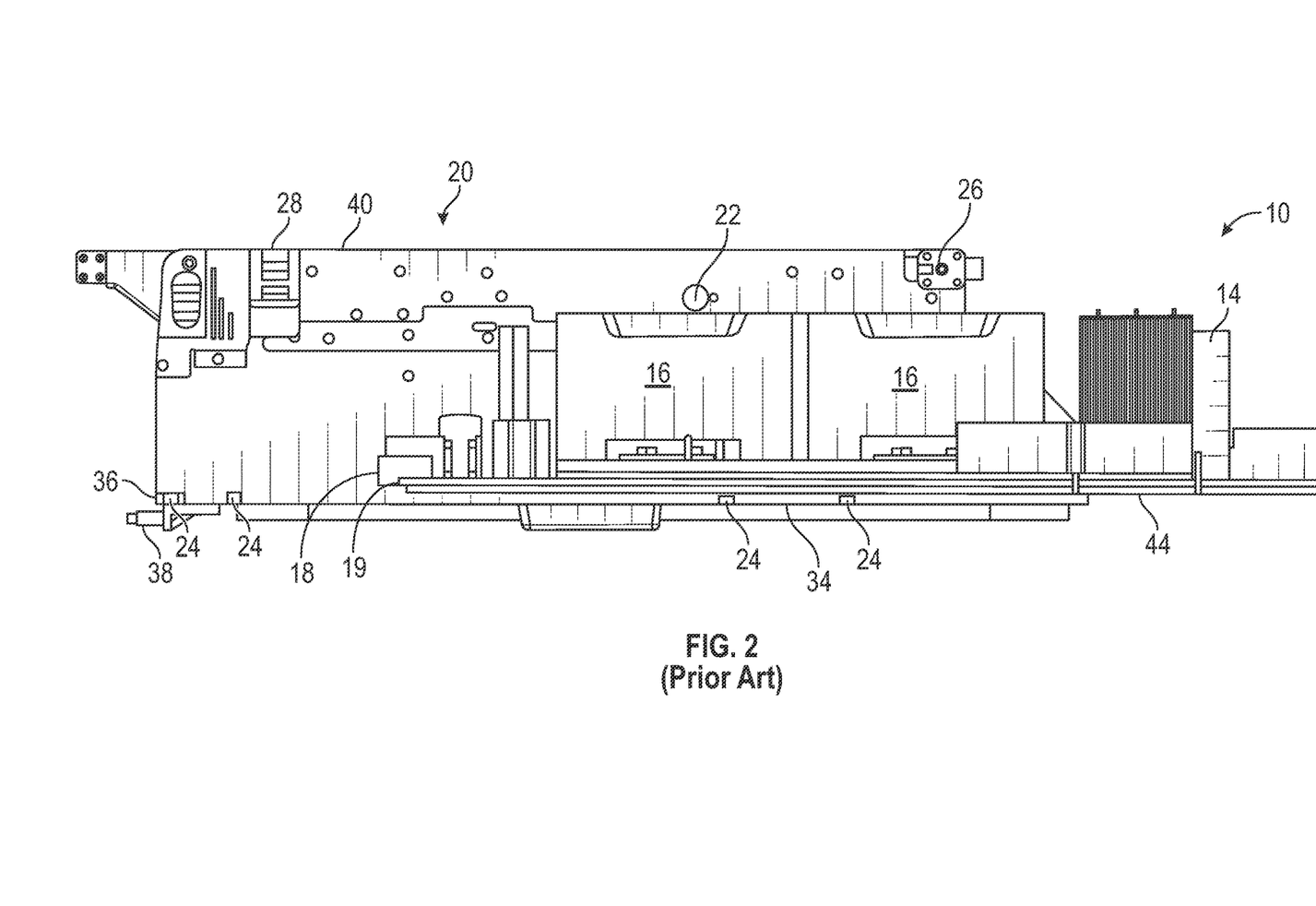
FIG. 2 is a right side view of the prior art GPU board and GPU tray of FIG. 1.

FIG. 2 is a right side view of the prior art GPU board and GPU tray of FIG. 1 with wall 42 transparent. FIG. 2 illustrates that when positioning board 10 within tray 20, care must be taken to prevent GPUs 16 from striking either beams 26, 28, or thumbscrew 22. At the same time, care must be taken to prevent the GPU board bottom from striking any of standoffs 24. However, because GPU board 10 when populated with GPU modules 16 weighs over 46 lbs., it is difficult for an installer to maneuver GPU board 10 in such a controlled manner and avoid hitting components of GPU board 10 against parts of GPU tray 20. For example, components 18 and others along GPU bottom 44 may accidentally hit standoffs 24, GPUs 16 may strike beams 26, 28 and thumbscrews 22. As a result, both GPU board 10 and GPU tray 20 may be damaged during assembly. Furthermore, removing a handle for GPU board installation and then re-assembling it afterwards is a production inefficiency.

Thus, what is needed is an apparatus that facilitates the installation of an electronic device board into an associated device tray and reduces the potential for damage in the process.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose an apparatus for loading an electronic device, e.g., a populated GPU board such as an HGX board, onto a device tray, e.g., a GPU tray, where the electronic device is cumbersome and the device tray presents obstacles that prevent simply lowering the device into the tray. The apparatus includes a dolly and a base, the base configured to position the dolly against the device tray so that the dolly, carrying the board, may be rolled into the tray to position the device and then, with the device lifted, be rolled back out from beneath the device. The device may then be lowered into position and secured. Thus, embodiments eliminate the need for an installer to support the weight of the device while at the same time maneuvering the device within the limited space. As a result, both the device and the tray are less likely to be damaged, the installer may install the device quicker and with more confidence that the installation will not damage the equipment, and the installer will be less fatigued by the process. An embodiment is adapted for a GPU board that is populated with eight GPU modules and related functional hardware.

Figure 3A:
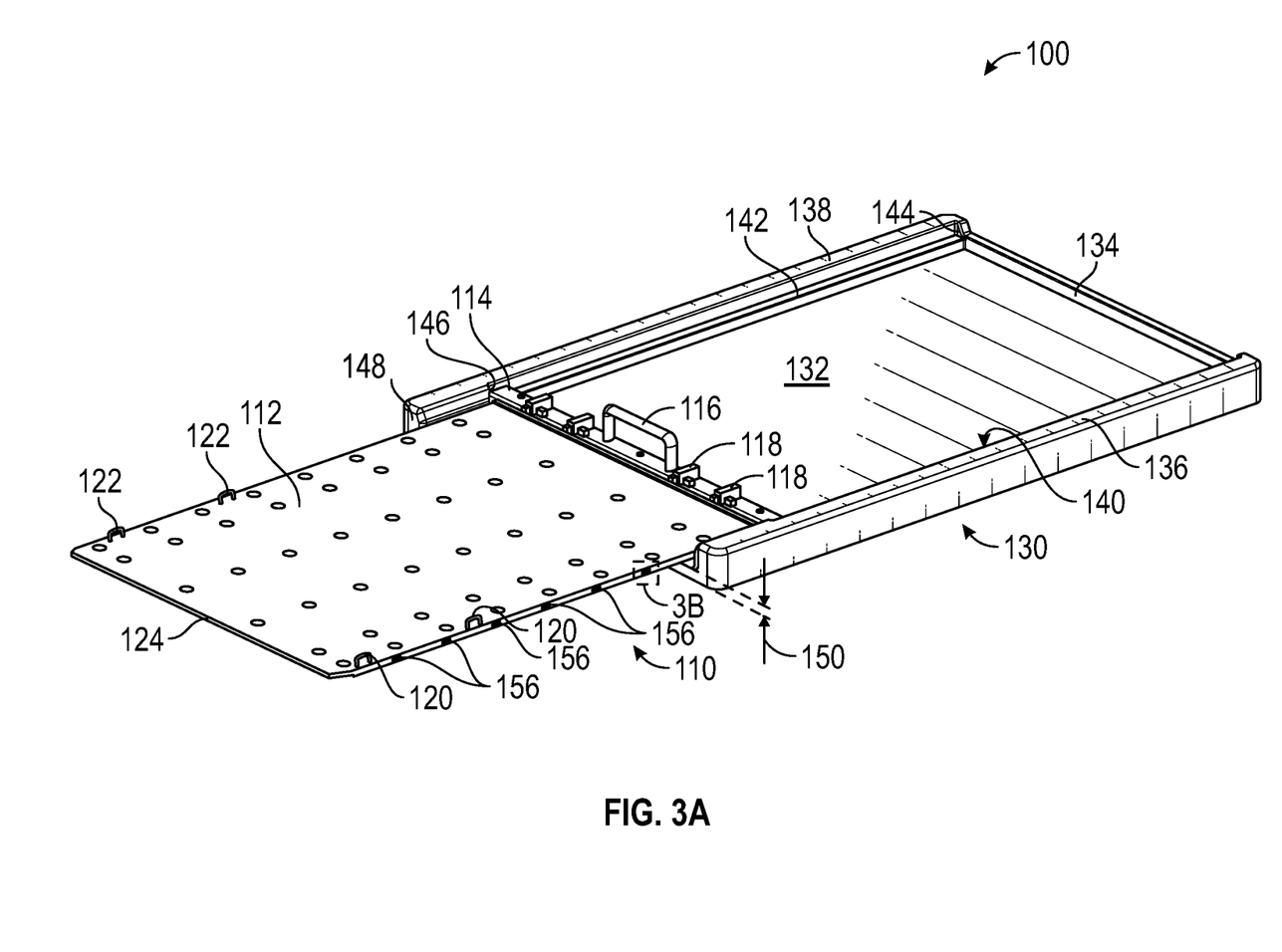
FIG. 3A is an upper front right isometric view of an embodiment of a board installation apparatus.

FIG. 3A is an upper front right isometric view of an embodiment of a board transport 100. This embodiment is for loading an electronic device onto a tray. In FIG. 3A, transport 100 includes a dolly 110 and a base 130. Dolly 110 includes a surface 112, a rear rail 114 with a handle 116. Rail 114 includes alignment pins 118, which insert into corresponding slots 162 (FIG. 8C) to control the side-to-side position of a board on surface 112. Side rollers 156 extend outwards from dolly 110 and help maintain dolly 110 centered within tray surface 34. Surface 112, between a front edge 124 and rear rail 114, provides a platform on which the board is placed. Side rollers 156 extending from dolly 110 also roll against base 130, facilitating the extension of dolly 110 from base 130. And alignment posts 120, 122 extend upward from dolly 110 to further define the area of surface 112 upon which maintain board 10 travels.

Base 130 includes a floor 132, side rails 136, 138, a front edge 148, and a rear edge 134. Side rails 136, 138 include a track 140, 142, respectively. Each track 140, 142 is configured to receive an end of rear rail 114. Rear rail 114 may slide within tracks 140, 142 between a rear stop 144 and a front stop 146 (shown with regard to rail 142). Rail 140 is a mirror image of rail 142 and the description of rail 142 applies equally to rail 140. Base 130 at front edge 148 has a thickness 150 dimensioned to allow base 130 to slide under a front section of tray 10 (further illustrated with regard to FIG. 7 and FIG. 9).

In FIG. 3A, dolly 110 is shown fully extended from base 130. When retracted, dolly 110 moves over floor 132 with rail 114 sliding within tracks 140, 142 until it abuts stop 144.

Figure 3B:
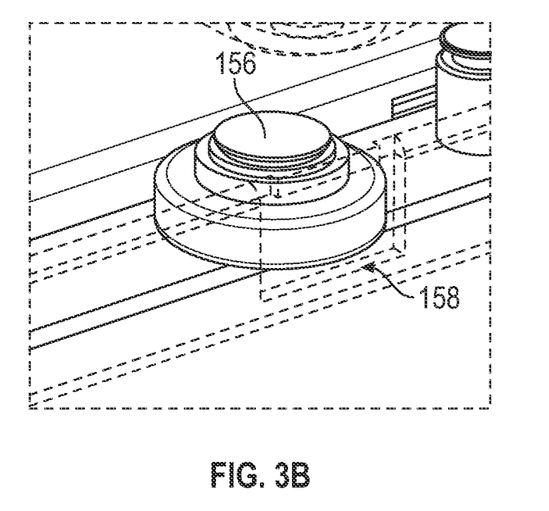
FIG. 3B further illustrates elements of the embodiment of a board installation apparatus of FIG. 3A.

In the retracted position, dolly 110 is within the four corners of base 130, such that dolly front edge 124 does not extend past base front edge 148. FIG. 3B further illustrates elements of the embodiment of the board installation apparatus of FIG. 3A. In FIG. 3B, side roller 156 is shown to extend sideward from dolly 110 through a window 158.

Thus, in an embodiment, board transport 100 (dolly 110 and base 130) are configured to convey GPU board 10 into GPU tray 20 to the final position of board 10. During this, dolly 110 supports the weight of GPU board 10 and maintains board 10 at a consistent height while transporting board 10 to its ultimate position. This eliminates collisions between board 10 and tray 20 and the resultant damage. When extending into tray 20, rail 114, travelling within tracks 140, 142, and side rollers 156 travelling along base sides 140, 142 and then the inner sides of tray sides 40, 42, guide dolly 110, which keeps dolly 110 from colliding with elements of tray 20.

In an embodiment of a method for loading an electronic device, e.g., GPU board 10, into a device tray, e.g., GPU tray 20, board transport 100 is positioned, with dolly 110 in the retracted position, with base 130 against tray 20. With height 150 equal to the height of the tray above the supporting bench, floor 132 and the floor of the tray will be in the same plane, or if not exactly the same plane, there will be no step between edge 148 and the tray floor. Board 10 may then be lowered onto surface 112 and aligned with pins 118. In position and loaded, dolly 110 may be rolled forward using handle 116 into tray 20 until rail 114 encounters stop 146 when it reaches the fully extended position (as shown in FIG. 3A). Board 10 is then lifted, using handles 12, 14 and dolly 110 withdrawn using handle 116. Board 10 may then be lowered directed onto tray 20 in the proper position and secured using screws to standoffs 24.

In an embodiment, board 10 may be installed into tray 20 as followings. In a first step, board 10 is lowered atop dolly 110. In a second step, board 10 is aligned with dolly 110 using alignment pins 118. In a third step, dolly 110 is pushed into tray 20. In a fourth step, board 10 is disengaged from the alignment pins. In a fifth step, board 10 is lifted by handles 12, 14 and dolly 110 is retracted onto base 130. In a sixth step, board 10 is lowered onto tray 20, aligning holes in board 10 with standoffs 24. In a seventh step, board 10 is secured to tray 20 with screws into standoffs 24.

Figure 4:
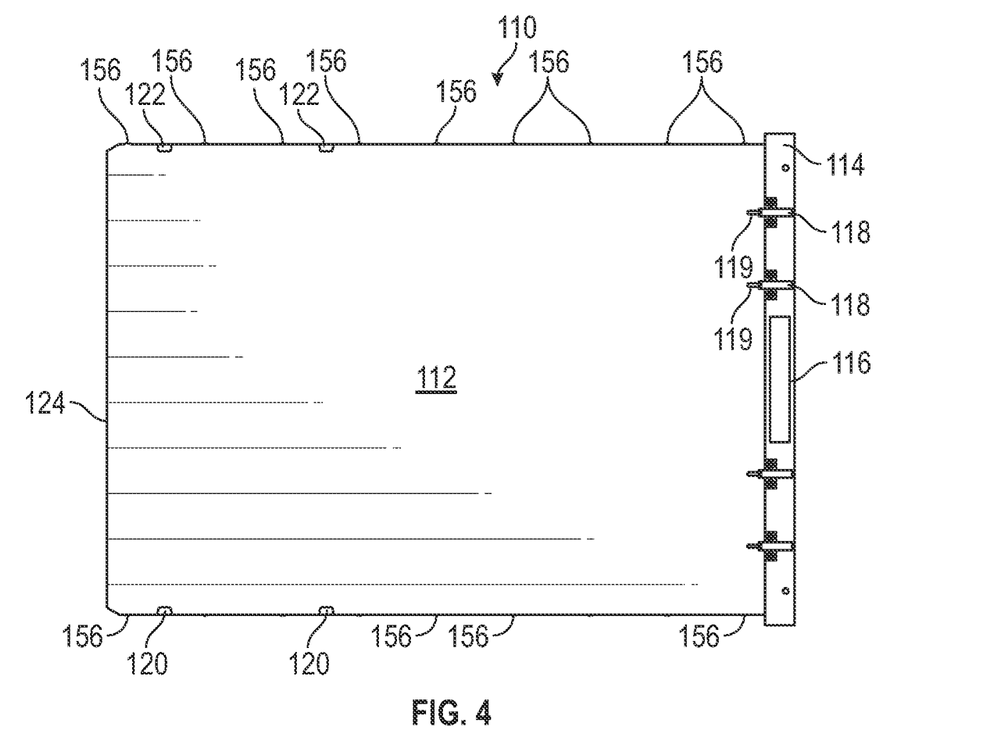
FIG. 4 is a top view of elements of the embodiment of a board installation apparatus of FIG. 3A.

FIG. 4 is a top view of elements of the embodiment of a board installation apparatus of FIG. 3A. In FIG. 4, each alignment pin 118 is shown to be equipped with a pinhead 119 and the positions of side rollers 156 are further illustrated.

Figure 5:
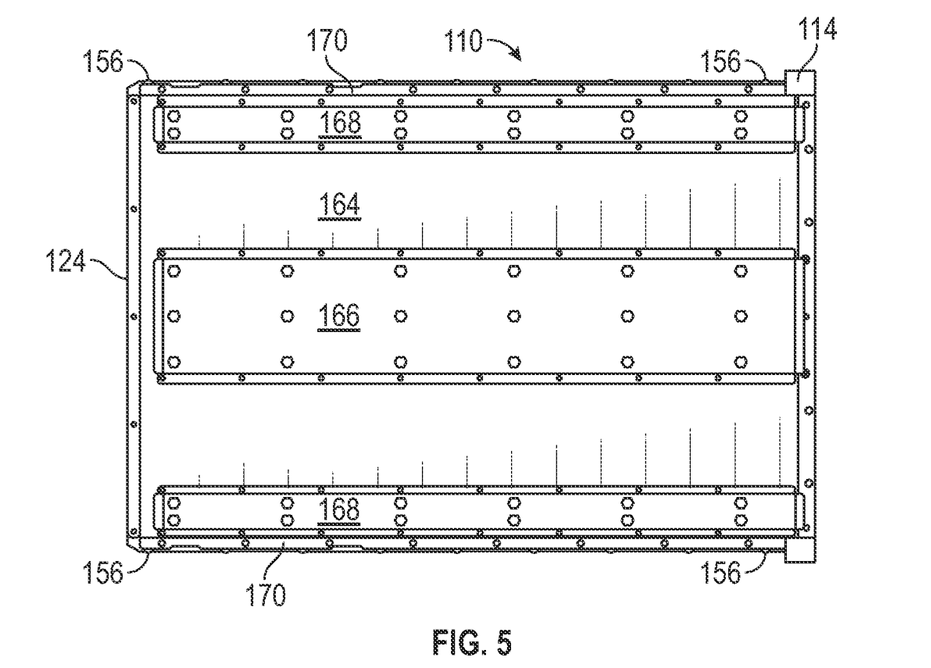
FIG. 5 is a bottom view of elements of the embodiment of the board installation apparatus of FIG. 3A.
Figure 6:
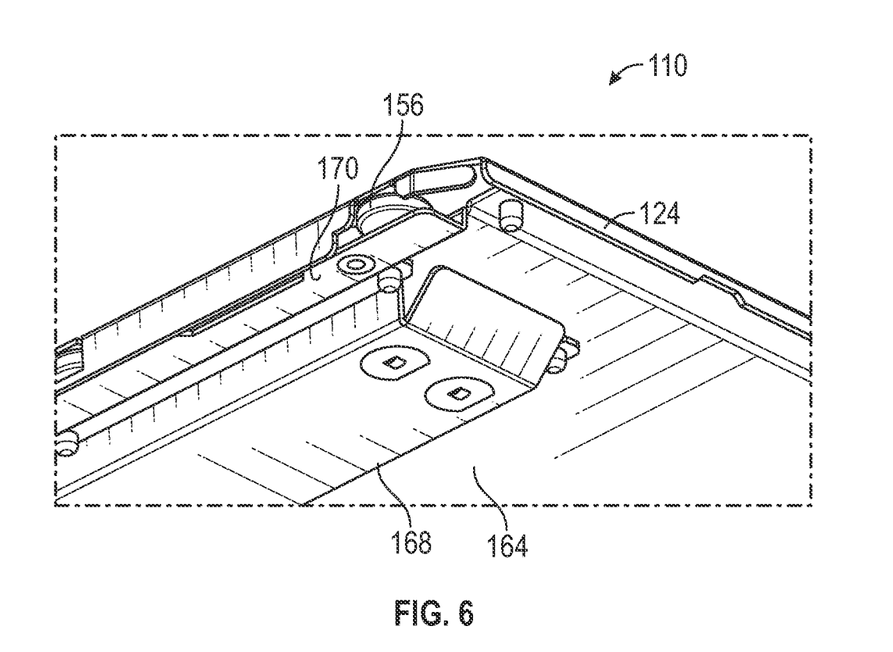
FIG. 6 is a lower front left isometric view of elements of the embodiment of a board installation apparatus of FIG. 3A.

FIG. 5 is a bottom view of elements of the embodiment of the board installation apparatus of FIG. 3A. In FIG. 5, dolly 110 is shown to include a bottom 164 to which are attached side runners 168 and a center runner 166. Runners 166 and 168 slide along surface 112 of dolly 110 and then along surface 34 tray 20 to position board 10 within tray 20. Dolly 110 is further equipped with flanges 170 and rollers 156 are sandwiched between flanges 170 and dolly surface 112. FIG. 6 is a lower front left isometric view of elements of the embodiment of a board installation apparatus of FIG. 3A illustrating the sandwiching of roller 156 between surface 112 and flange 170.

Figure 7:
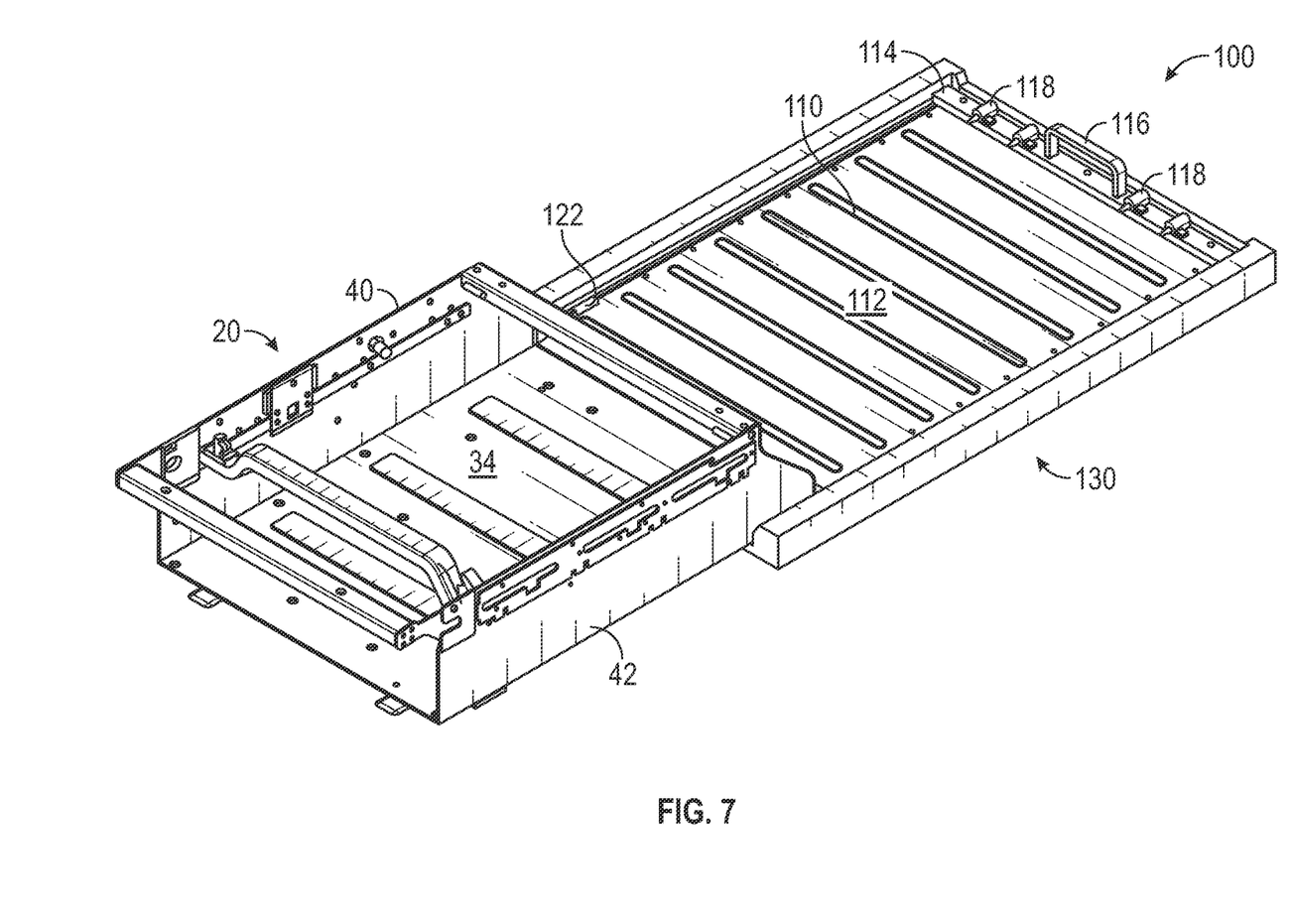
FIG. 7 is an upper front right isometric view of a use case for the embodiment of a board installation apparatus of FIG. 3A.

FIG. 7, is an upper front right isometric view of a use case for the embodiment of a board installation apparatus of FIG. 3A. In FIG. 7, tray 20 is shown partially received into base 130. Thus, for dolly 110 to roll smoothly onto base 34 of tray 20 without encountering a step transition, a step 176 (FIG. 9) may be provided within base 130 to receive tray 20 so that base surface 132 is level with tray surface 34.

Figure 8A:
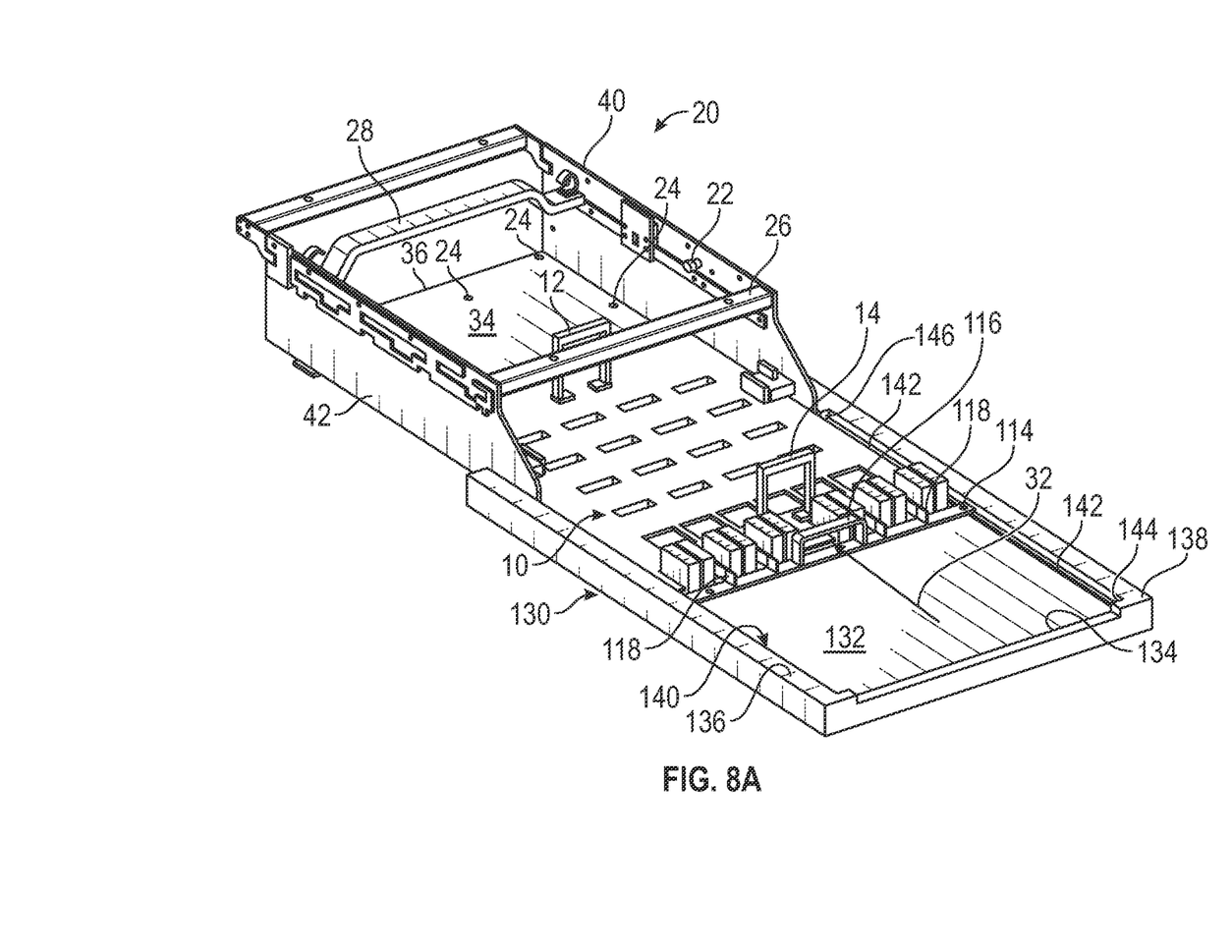
FIG. 8A is an upper rear left isometric view of the use case for the embodiment of a board installation apparatus of FIG. 3A.
Figure 8B:
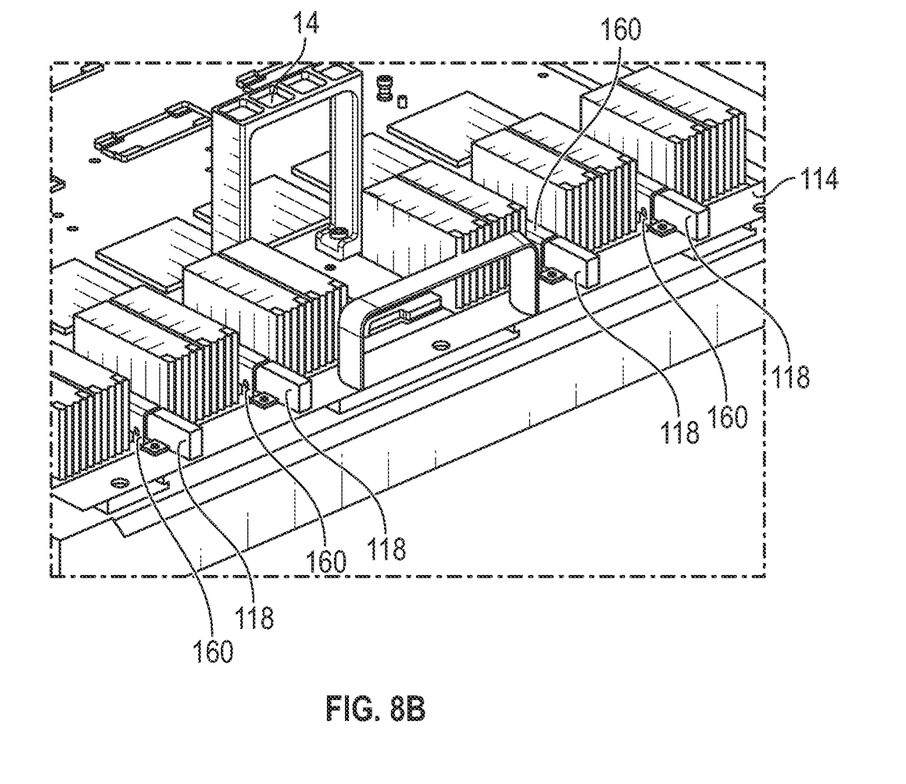
FIG. 8B is an upper rear right isometric view further illustrating elements of the embodiment of a board installation apparatus of FIG. 3A.
Figure 8C:
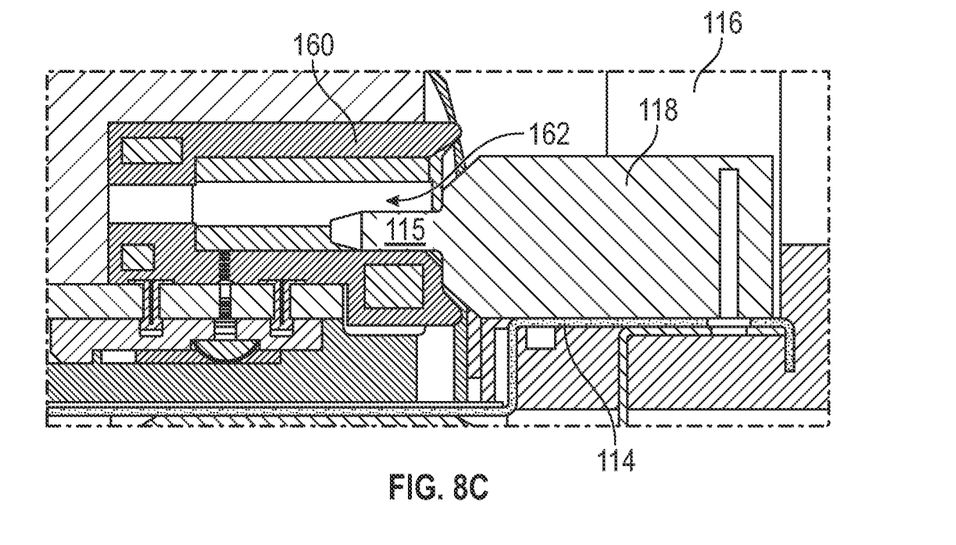
FIG. 8C is a right-side view further illustrating elements of the embodiment of a board installation apparatus of FIG. 3A.

FIG. 8A is an upper rear left isometric view of a use case for the embodiment of a board installation apparatus of FIG. 3A. In FIG. 8A, board 10 is aligned to dolly 110 using pins 118. GPUs 16 are not depicted for clarity in describing the movement of dolly 110. With base 130 against tray 20 and board 10 loading onto dolly 110, base 130 has been translated forward 32. Handle 12 has passed under beam 26. Base 130 may be fully extended, the result of which is board front edge 19 aligning over tray back edge 36. In the travel between retracted and extended positions, dolly 110 and board 10 are guided beneath and past obstacles on tray 20 and arrive in the extended position without damage to either tray 20 or board 10. In FIG. 8B, pinheads 119 of alignment pins 118 are shown received within pin sockets 160 affixed to board 10. In FIG. 8C, pinheads 119 are shown to be received within slot 162 of pin socket 160.

Figure 9:
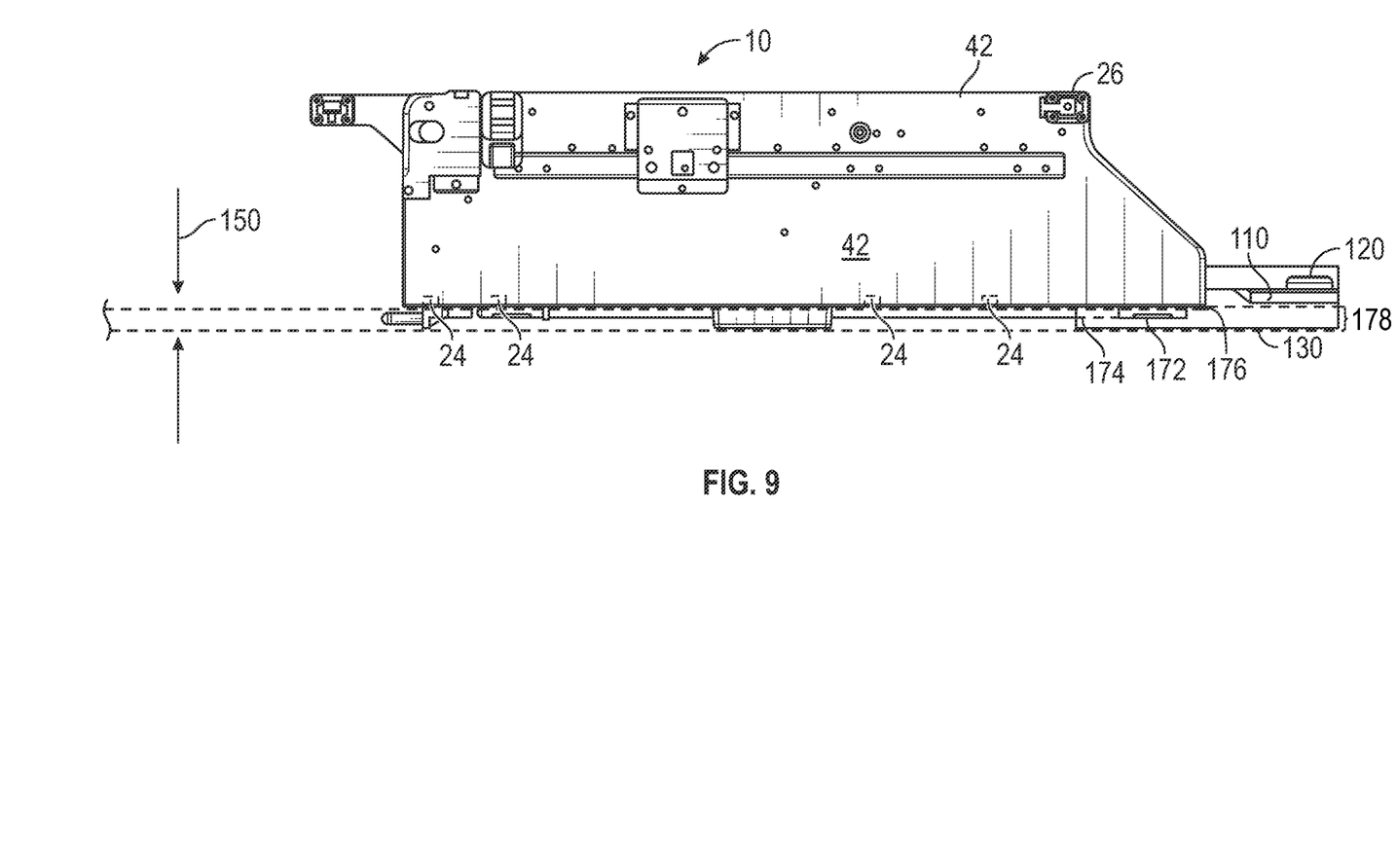
FIG. 9 is a right-side view of the use case for the embodiment of a board installation apparatus of FIG. 7.

FIG. 9 is a right side view of the use case for an embodiment of a board installation apparatus. In FIG. 9, tray 10 may be provided with a tooth 172. Base 130 may be provided with a corresponding groove 174. When tray 10 is received by base 130, tooth 172 may move within groove 174 to ensure proper alignment. FIG. 9 also illustrates a step 176 provided in base 130 to accommodate tray 10. Step 176 steps up from height 150 (corresponding to the height of tray 10 above the support surface) to a height 178 (corresponding to a height of tray surface 34 and base surface 132). Step 176 thus provides for a flat transition for dolly 110 to slide from base floor 132 to tray surface 34.

Embodiments may provide the following advantages: 1. a reduced rate of damage to the expensive GPU board achieved by avoiding collisions between the GPU board and the surrounding structure; improved ergonomics achieved by eliminating the step that requires human strength to lift the heavy GPU and move it laterally; a reduced assembly time achieved by eliminating the step of removing and re-installing a GPU tray beams; an improvement in the accuracy of mating the GPU board to the standoffs on the GPU tray.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a base including a first side wall, a second side wall, a first floor between the first and second side walls, the first floor having a front edge; and
a plate having a plurality of runners, a first plurality of rollers on a first plate side, a second plurality of rollers on a second plate side and a rail attached to a first end of the plate, the rail comprising a handle configured to facilitate a user pushing the plate in the first direction, the plate configured to fit between the first and second side walls with the first plurality of rollers in movable contact with the first side wall, the second plurality of rollers in movable contact with the second side wall, and the plurality of runners in slidable contact with the floor, wherein: when the apparatus is horizontal, horizontal movement of the plate is constrained by the first and second side walls to a first direction allowing the plate to extend past the front edge and return in an opposite direction to the first direction.

2. The apparatus of claim 1 further including a first track disposed on the first side wall and terminating with a first stop and a second track disposed on the second side wall and terminating with a second stop, wherein, when the plate moves in the first direction, the rail moves along each track and movement of the plate in the first direction is limited by the rail encountering the first stop and the second stop.

3. The apparatus of claim 1 further including a plurality of pins provided along the rail and configured to be received within corresponding slots of a device.

4. The apparatus of claim 1, wherein the first floor includes a step at the front edge dimensioned such that the base may receive a tray within the step and position a second floor of the tray at a height of the first floor.

5. The apparatus of claim 4, wherein the plurality of runners are provided on a bottom of the plate such that the bottom, when then plate is slid along the first floor, is maintained at a first distance above the first floor.

6. The apparatus of claim 5, wherein a minimum value of the first distance is determined by a first obstacle on the second floor.

7. The apparatus of claim 6, wherein the plurality of runners are provided on the bottom such that no runner encounters the first obstacle when moved in the first direction.

8. The apparatus of claim 6, wherein a maximum value of the first distance is determined by a second obstacle attached to the tray a second distance from the second floor and a height of a device, such that the plate with the device may pass between the second obstacle and the second floor when slid along the second floor.

9. A system comprising:
a device;
a device tray dimensioned to receive the device; and
a loader including:
a base including a first side wall, a second side wall, a first floor between the first and second side walls, the first floor having a front edge; and
a plate having a plurality of runners, a first plurality of rollers on a first plate side, a second plurality of rollers on a second plate side and a rail attached to a first end of the plate, the rail comprising a handle configured to facilitate a user pushing the plate in the first direction, the plate configured to fit between the first and second side walls with the first plurality of rollers in movable contact with the first side wall, the second plurality of rollers in movable contact with the second side wall, and the plurality of runners in slidable contact with the first floor,
wherein: when the system is oriented such that the plate is horizontal, horizontal movement of the plate is constrained by the first and second side walls to a first direction allowing the plate to extend past the front edge and return in an opposite direction to the first direction.

10. The system of claim 9, the loader further including a first track disposed on the first side wall and terminating with a first stop and a second track disposed on the second side wall and terminating with a second stop, wherein, when the plate moves in the first direction, the rail moves along each track and movement of the plate in the first direction is limited by the rail encountering the first stop and the second stop.

11. The system of claim 9, the loader further including a plurality of pins provided along the rail and configured to be received within corresponding slots of the device.

12. The system of claim 9, wherein the first floor includes a step at the front edge dimensioned such that the base may receive a tray within the step and position a second floor of the tray at a height of the first floor.

13. The system of claim 12, wherein the plurality of runners are provided on a bottom of the plate such that the bottom, when then plate is slid along the first floor, is maintained at a first distance above the first floor.

14. The system of claim 13, wherein a minimum value of the first distance is determined by a first obstacle on the second floor.

15. The system of claim 14, wherein the plurality of runners are provided on the bottom such that no runner encounters the first obstacle when moved in the first direction.

16. The system of claim 14, wherein a maximum value of the first distance is determined by a second obstacle attached to the tray a second distance from the second floor and a height of a device, such that the plate with the device may pass between the second obstacle and the second floor when slid along the second floor.

* * * * *